United States Patent
Liu et al.

(10) Patent No.: US 11,183,142 B2
(45) Date of Patent: Nov. 23, 2021

(54) THIN FILM TRANSISTOR, GATE DRIVER CIRCUIT AND DISPLAY APPARATUS

(71) Applicant: BOE TECHNOLOGY GROUP CO., LTD., Beijing (CN)

(72) Inventors: Fengjuan Liu, Beijing (CN); Ying Han, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 77 days.

(21) Appl. No.: 16/493,429

(22) PCT Filed: May 6, 2019

(86) PCT No.: PCT/CN2019/085710
§ 371 (c)(1),
(2) Date: Sep. 12, 2019

(87) PCT Pub. No.: WO2020/062871
PCT Pub. Date: Apr. 2, 2020

(65) Prior Publication Data
US 2020/0193932 A1 Jun. 18, 2020

(30) Foreign Application Priority Data
Sep. 29, 2018 (CN) .......................... 201811149006.X

(51) Int. Cl.
*H01L 29/04* (2006.01)
*G09G 5/00* (2006.01)
*H01L 33/14* (2010.01)

(52) U.S. Cl.
CPC ............. *G09G 5/003* (2013.01); *H01L 33/14* (2013.01); *G09G 2300/0426* (2013.01); *G09G 2310/0264* (2013.01)

(58) Field of Classification Search
CPC .......... G09G 2300/0426; G09G 5/003; G09G 2310/0264; H01L 33/14
See application file for complete search history.

(56) References Cited

U.S. PATENT DOCUMENTS

| 9,373,642 B2 | 6/2016 | Mao et al. |
| 2004/0135175 A1 | 7/2004 | Kurokawa |

(Continued)

FOREIGN PATENT DOCUMENTS

| CN | 101217154 A | 7/2008 |
| CN | 101915624 A | 12/2010 |

(Continued)

OTHER PUBLICATIONS

International Search Report dated Jul. 30, 2019, issued in counterpart application No. PCT/CN2019/085710. (11 pages).

(Continued)

*Primary Examiner* — Samuel A Gebremariam
(74) *Attorney, Agent, or Firm* — Westerman, Hattori, Daniels & Adrian, LLP

(57) ABSTRACT

The present disclosure relates to a thin film transistor. The thin film transistor may include a substrate, a source electrode on the substrate, a drain electrode on the substrate, a gate on the substrate, and an active layer on the substrate. The source electrode may include a first teeth portion. The drain electrode may include a second teeth portion. The gate may include a third teeth portion. The active layer may include a plurality of channel regions. The first teeth portion, the second teeth portion, the third teeth portion, and the active layer form a plurality of sub-thin film transistors connected in parallel. The center sub-thin film transistor has a channel region having a smallest width-to-length ratio among the plurality of sub-thin film transistors.

20 Claims, 13 Drawing Sheets

(56) References Cited

U.S. PATENT DOCUMENTS

2016/0336351 A1* 11/2016 Li .................. G02F 1/1368
2018/0256314 A1    9/2018 Hekmatshoartabari et al.

FOREIGN PATENT DOCUMENTS

| CN | 203134808 U | 8/2013 |
| CN | 104091830 A | 10/2014 |
| CN | 106531745 A | 3/2017 |
| CN | 107204375 A | 9/2017 |
| CN | 109309100 A | 2/2019 |

OTHER PUBLICATIONS

Office Action dated Apr. 13, 2020, issued in counterpart CN Application No. 201811149006.X, with English Translation. (9 pages).

* cited by examiner

THIN FILM TRANSISTOR, GATE DRIVER CIRCUIT AND DISPLAY APPARATUS

CROSS-REFERENCE TO RELATED APPLICATION

This application claims benefit of the filing date of Chinese Patent Application No. 201811149006.X filed on Sep. 29, 2018, the disclosure of which is hereby incorporated in its entirety by reference.

TECHNICAL FIELD

The present disclosure relates to the field of display technology, and in particular, to a thin-film transistor, a gate driver circuit, and a display apparatus.

BACKGROUND

Nowadays, display panels having a narrow frame have become a trend. A gate driver circuit is integrated in the array substrate in the display panel, that is, a Gate Driver-On-Array (GOA) technology is employed. GOA generally requires thin film transistors having a high ratio of channel width over channel length to achieve a large current, in order to ensure the display effect of the display panel. Currently, thin film transistors having a high ratio of channel width over channel length generally employ a plurality of comb-shaped thin film transistors connected in parallel.

BRIEF SUMMARY

One embodiment of the present disclosure provides a thin film transistor. The thin film transistor may include a substrate, a source electrode on the substrate, a drain electrode on the substrate, a gate on the substrate, and an active layer on the substrate. The source electrode may include a first teeth portion. The first teeth portion may include a plurality of teeth arranged at intervals in a first direction. The drain electrode may include a second teeth portion, and the second teeth portion may include a plurality of teeth arranged at intervals in the first direction. The gate may include a third teeth portion, and the third teeth portion may include a plurality of teeth arranged at intervals in the first direction. The active layer may include a plurality of channel regions arranged at intervals in the first direction. Each of the plurality of channel regions has a length in the first direction and a width in a second direction. The second direction is perpendicular to the first direction. The first teeth portion, the second teeth portion, the third teeth portion, and the active layer form a plurality of sub-thin film transistors connected in parallel, and the plurality of sub-thin film transistors comprises at least a center sub-thin film transistor at a center position of the plurality of sub-thin film transistors in the first direction. The center sub-thin film transistor has a channel region having a smallest width-to-length ratio among the plurality of sub-thin film transistors.

Optionally, a length of the channel region of the center sub-thin film transistor is longest among those of the plurality of sub-thin film transistors, and widths of the channel regions of the plurality of sub-thin film transistors are the same.

Optionally, lengths of channel regions of the plurality of sub-thin film transistors except the center sub-thin film transistor are the same.

Optionally, a length of a channel region of a sub-thin film transistor among the plurality of sub-thin film transistors decreases as a distance of the respective sub-thin film transistor from the center sub-thin film transistor increases.

Optionally, the active layer is divided into a plurality of separated segments in the second direction.

Optionally, the plurality of the separated segments of the active layer has a same width in the second direction.

Optionally, the plurality of the separated segments of the active layer has different widths in the second direction.

Optionally, a width in the second direction of at least one center segment among the plurality of separated segments is smaller than a width in the second direction of each of the other segments of the plurality of separated segments.

Optionally, a width of the channel region of the center sub-thin film transistor is shortest among those of the plurality of sub-thin film transistors, and lengths of the channel regions of the plurality of sub-thin film transistors are the same.

Optionally, widths of the channel regions of the other sub-thin film transistors except the center sub-thin film transistor are the same.

Optionally, a width of a channel region of a sub-thin film transistor among the plurality of sub-thin film transistors increases as a distance of the respective sub-thin film transistor from the center sub-thin film transistor increases.

Optionally, the active layer is divided into a plurality of separated segments in the second direction.

Optionally, the plurality of the separated segments of the active layer has a same width in the second direction.

Optionally, a width in the second direction of at least one center segment among the plurality of separated segments is smaller than a width in the second direction of each of the other segments of the plurality of separated segments.

Optionally, a length of the channel region of the center sub-thin film transistor is longest among those of the plurality of sub-thin film transistors, and a width of the channel region of the center sub-thin film transistor is shortest among those of the plurality of sub-thin film transistors.

Optionally, a length of a channel region of a sub-thin film transistor among the plurality of sub-thin film transistors decreases as a distance of the respective sub-thin film transistor from the center sub-thin film transistor increases.

Optionally, a width of a channel region of a sub-thin film transistor among the plurality of sub-thin film transistors increases as a distance of the respective sub-thin film transistor from the center sub-thin film transistor increases.

One example of the present disclosure is a gate driver circuit comprising the thin-film transistor according to one embodiment of the present disclosure.

One example of the present disclosure is an array substrate comprising the gate driver circuit according to one embodiment of the present disclosure.

One example of the present disclosure is a display apparatus comprising the array substrate according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
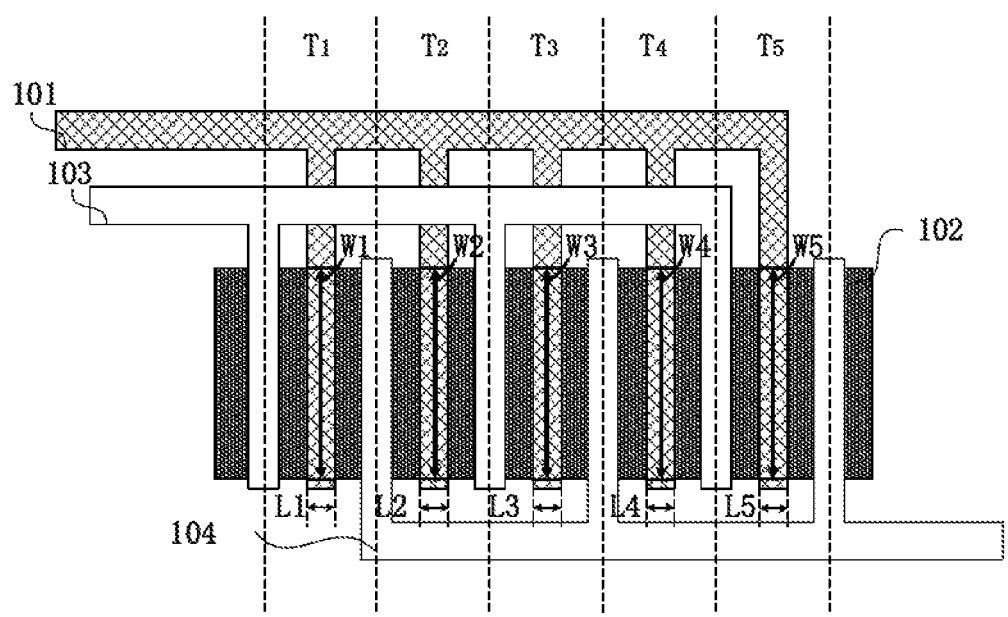
FIG. 1 is a schematic structural view of a comb-shaped thin film transistor in related art.

In order to make the objects, technical solutions, and advantages of the embodiments of the present disclosure more apparent, the technical solutions according to the embodiments of the present disclosure will be described below clearly and fully with reference to the drawings, but the embodiments described below are only particular embodiments, which are not intended to represent all embodiments of the present disclosure. Based upon the embodiments in the present disclosure, other embodiments which will be apparent to those skilled in the art are within the scope of the present disclosure.

When an element and an embodiment of the present disclosure are introduced, the articles "a", "an", "the" and "said" are intended to indicate that one or more elements are present. The terms "comprising", "including", "containing" and "having" are intended to be inclusive and mean that there may be additional elements other than the listed elements.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covered with", "on top of", "positioned on", or "positioned on top of" mean that, for example, a first element of a first structure is on a second element of a second structure, wherein an intermediate element such as an intermediate structure may exist between the first element and the second element. The term "contact" means that, for example, the first element of the first structure and the second element of the second structure are connected directly or indirectly, and other elements may exist or not exist at the interface between the two elements.

Unless otherwise defined, all the terms (including the technical and scientific terms) used herein have the same meanings as commonly understood by one of ordinary skill in the art to which the present disclosure is directed. It is also understood that the terms such as defined in the usual dictionary should be interpreted as having the same meanings as the meaning in the context of the relevant technology. The terms should not be interpreted as an idealization or as having extreme meanings, unless they are explicitly defined herein. As employed herein, the statement that two or more parts are "connected" or "coupled" together shall mean that the parts are joined together either directly or joined through one or more intermediate parts.

In the description of the present disclosure, the terms "center," "horizontal," "vertical," "length," "width," "thickness," "upper," "lower," "front," "back," "left," "right," "top," "bottom," "inner," "outer," or the like are based on the orientation or positional relationship shown in the drawings. They are used merely for convenience of description and simplifying description of the present invention, but not to indicate or imply that the indicated apparatus or element must have a specific orientation, or be constructed and operated in a specific orientation, therefore cannot be construed as a limitation of the present disclosure.

In addition, the terms "first" and "second" or the like are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

FIG. 1 is a schematic structural view of a comb-shaped thin film transistor having an ultra-high width/length ratio.

As shown in FIG. 1, the comb-shaped thin-film transistor includes a substrate (not shown), a comb-shaped gate 101, an active layer 102, a gate insulation layer (not shown) between the gate 101 and the active layer 102, a comb-shaped source electrode 103, and a comb-shaped drain electrode 104. A first teeth portion, for example, containing three teeth, of the source electrode 103 and a second teeth portion, for example, containing three teeth, of the drain electrode 104 are alternately arranged along a first direction. For example, the first direction may be a horizontal direction. The orthographic projections of the first teeth portion and the second teeth portion on the substrate partially intersect the active layer 102 and form a source region and a drain region, respectively, on the active layer 102. The teeth can be a regular shape such as rectangles, or an irregular shape, for example, including partial curves.

A third teeth portion, for example, containing five teeth, of the gate 101 is positioned so that teeth of the third teeth portion are respectively located between an adjacent tooth of the first teeth portion and an adjacent tooth of the second teeth portion. A region where the orthographic projection of each tooth of the third teeth portion on the substrate intersects with the active layer 102 (that is, a first intersect area) forms a channel region on the active layer 102. Thus, the first teeth portion, the second teeth portion, the third teeth portion, and the active layer 102 form five sub-thin film transistors T1, T2, T3, T4, and T5 connected in parallel on the substrate. In the thin-film transistor as shown in FIG. 1, the sub-thin film transistors T2 and T1 share the first tooth of the second teeth portion of the drain electrode 104, and the sub-thin film transistors T2 and T3 share the second tooth of the first teeth portion of the source electrode 103. The sub-thin-film transistor T3 and the sub-thin film transistor T4 share the second tooth of the second teeth portion of the drain electrode 104. The sub-thin-film transistor T4 and the sub-thin film electrode T5 share the third tooth of the first teeth portion of the source electrode 103.

In addition, the lengths of the channel regions of the sub-thin film transistors T1, T2, T3, T4, and T5 (that is, the dimensions of the first intersect area in the horizontal direction) are respectively identified as L1, L2, L3, L4, and L5, and the widths of the channel regions (that is, the dimensions of the first intersect area in the vertical direction) are respectively identified as W1, W2, W3, W4, and W5. The respective widths of the channel regions of the five sub-thin film transistors are the same. The respective lengths of the channel regions of the five sub-thin film transistors are the same.

In the array substrate containing the thin film transistor as shown in FIG. 1, when a voltage is supplied to the array substrate, because the voltage is constant, the heat Q generated by each sub-thin film transistor is calculated as $Q=U^2/RT$, where U is the voltage between the source electrode and the drain electrode of the sub-thin film transistor, R is the resistance of the channel region of the sub-thin film transistor and T is the operating time of the sub-thin-film transistor. Since the heat generation effect of other components of the sub-thin film transistor is not noticeable, therefore, only the resistance of the channel region is considered herein. Therefore, the heat Q generated by the sub-thin film transistor per unit time is inversely proportional to the resistance R of the channel region. The resistance R of the channel region is related to the ratio of channel width over channel length (W/L) of the channel region. That is, the larger the W/L ratio, the smaller the resistance. Therefore, the heat generated by the sub-thin film transistor is inversely proportional to its W/L ratio.

In the example of FIG. 1, since the widths and lengths of the channel regions of the five sub-thin film transistors are the same, each channel region generates the same amount of heat as the others. Therefore, the sub-thin film transistors T1, T2, T4, and T5 at two sides cause increased heat radiation toward the center sub-thin film transistor T3. Thus, the center region of the thin-film transistor is easily burnt out due to overheating.

In order to solve this technical problem, the present disclosure provides a novel thin-film transistor. In one embodiment, the maximum length to width ratio of the first intersect area of the center sub-thin film transistor is used so that the amount of heat generated by the center sub-thin-film transistor is reduced. As a result, the center region of the thin-film transistor is prevented from being burnt out due to overheating. The thin-film transistor according to an embodiment of the present disclosure will be described in detail below with reference to the accompanying figures. In the following embodiments of the present disclosure, for convenience of explanation, the thin film transistor has a structure similar to that of the thin film transistor as shown in FIG. 1, and therefore, descriptions of the same portions are appropriately omitted.

Figure 2:
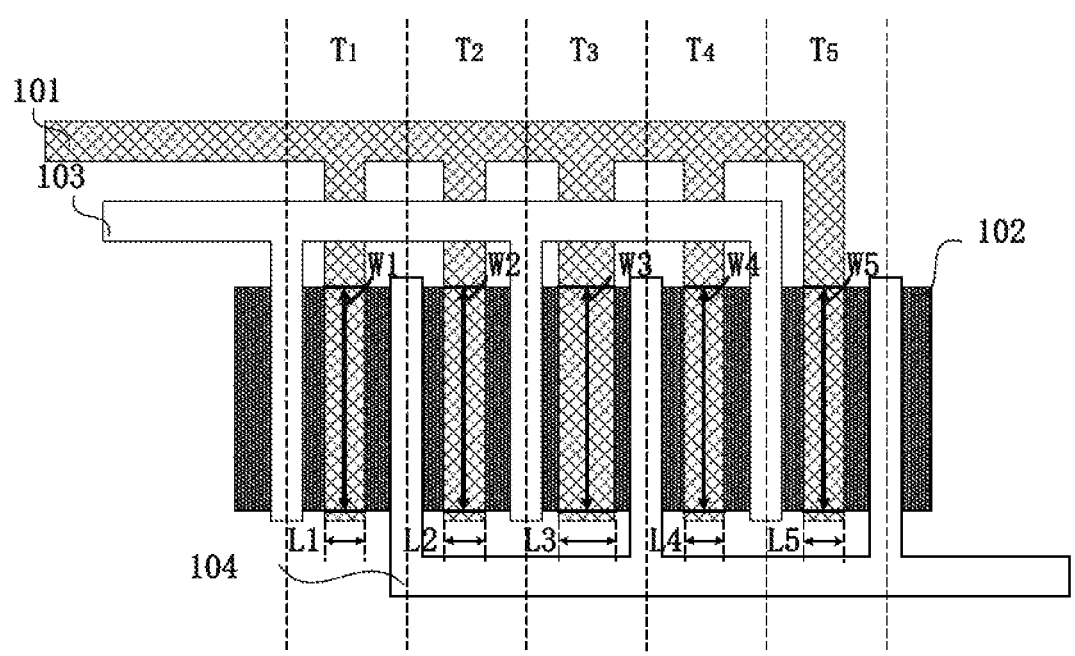
FIG. 2 is a schematic structural view of a thin-film transistor according to a first embodiment of the present disclosure.

FIG. 2 is a schematic view of a thin film transistor according to a first embodiment of the present disclosure.

As shown in FIG. 2, the widths W1, W2, W3, W4, and W5 of the channel regions of the sub-thin film transistors T1, T2, T3, T4, and T5 of the thin film transistor are the same, and the channel region of the center sub-thin film transistor T3 has the longest length L3. Further, the lengths L1, L2, LA, and L5 of the channel regions of the sub-thin-film transistors T1, T2, T4, and T5 are the same and shorter than L3.

In the present embodiment, the width-to-length ratio W3/L3 of the center sub-thin film transistor T3 is the smallest when compared to the width-to-length ratio of each of the other sub-thin film transistors T1, T2, T4, and T5. Accordingly, the resistance of the channel region of the center sub-thin-film transistor T3 is the largest. Therefore, during the operation of the thin-film transistor, the amount of heat generated by the center sub-thin film transistor T3 is minimized, and as a result, the center region of the thin film transistor can be effectively prevented from being burnt out due to overheating.

In the present embodiment, although only the center sub-thin film transistor T3 located in the center of the thin film transistor is set to have the longest channel region, one skilled in the art can fully understand that a plurality of sub-thin film transistors located in the center of the thin film transistors can also be set to have the longest channel region. For example, the lengths of the channel regions of the sub thin-film transistors T2, T3, and T4 may also set to be the longest.

Figure 3:
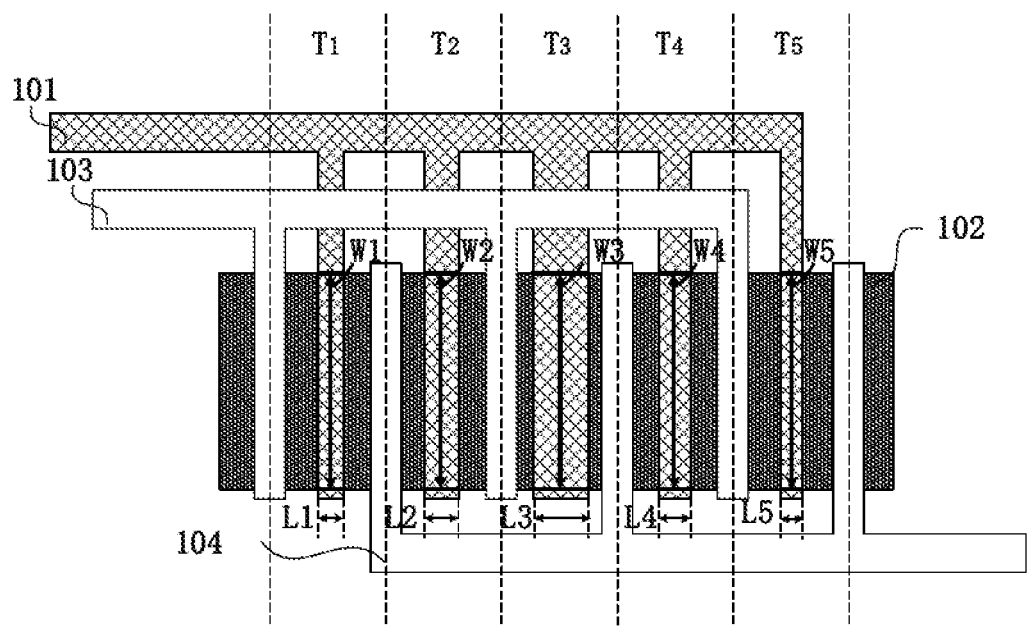
FIG. 3 is a schematic structural view of a thin-film transistor according to a second embodiment of the present disclosure.

FIG. 3 is a schematic view of a thin film transistor according to a second embodiment of the present disclosure. In this embodiment, the widths W1, W2, W3, W4, and W5 of the channel regions of the sub-thin film transistors T1, T2, T3, T4, and T5 are the same. The length of the channel region of the center sub-thin film transistor T3 is the longest. The larger the distance of the respective sub-thin film transistors T1, T2, T4 and T5 from the center sub-thin film transistor T3, the shorter the lengths L1, L2, L4 and L5 of the channel regions of the sub-thin film transistors T1, T2, T4, and T5. That is, the lengths of the channel regions decrease sequentially from the sub-thin film transistor at the center region to the sub-thin film transistors at both sides of the thin film transistor.

As shown in FIG. 3, the sub-thin film transistors T1 and T5 are farthest from the center sub-thin film transistor T3, and the sub-thin film transistors T2 and T4 are closer to the center sub-thin film transistor T3. Therefore, the lengths L1 and L5 of the channel regions of the sub thin-film transistors T1 and T5 are the shortest, the lengths L2 and L4 of the channel regions of the sub-thin-film transistors T2 and T4 are longer than the lengths L1 and L5 of the channel regions of the sub thin-film transistors T1 and T5, and the length of the channel region of the center sub-thin-film transistor T3 is the longest. Therefore, the width-to-length ratio W3/L3 of the channel region of the center sub-thin film transistor T3 is the smallest, and the channel region of the center sub-thin film transistor T3 has the largest resistance. Accordingly, the center sub-thin film transistor T3 generates the least amount of heat.

Figure 4:
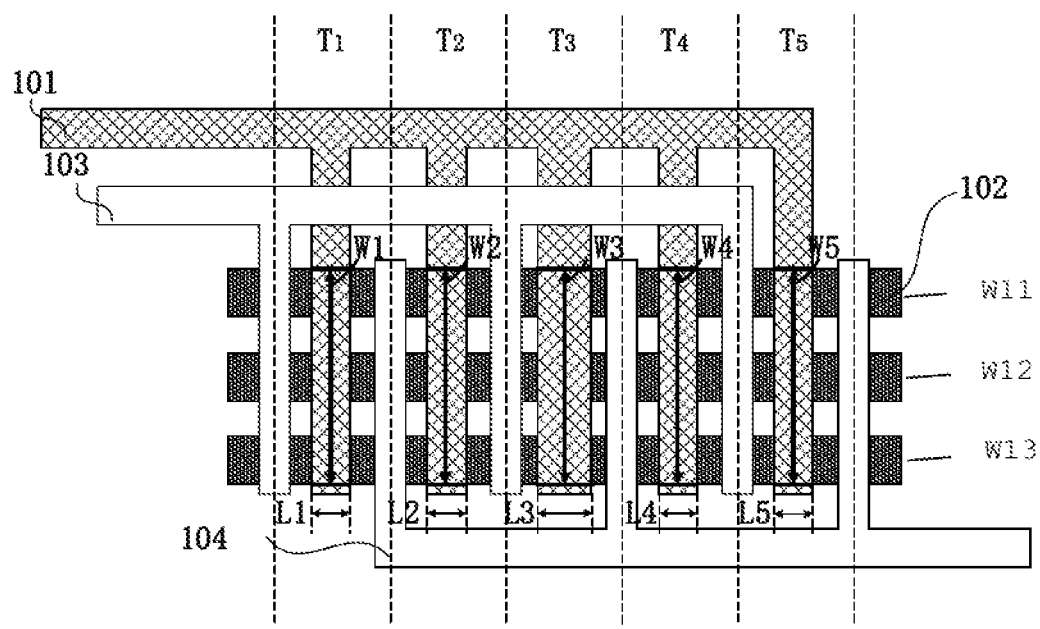
FIG. 4 is a schematic structural view of a thin-film transistor according to a third embodiment of the present disclosure.

FIG. 4 is a schematic view of a thin-film transistor according to a third embodiment of the present disclosure. In this embodiment, the active layer of the thin-film transistor of the first embodiment as shown in FIG. 2 is further divided into three segments of equal width in the width direction.

As shown in FIG. 4, the active layer 102 of the thin-film transistor is divided into three segments in the vertical direction. The widths of the three segments, W11, W12, and W13 are the same. In the present embodiment, the width of the channel region of each of the sub-thin film transistor is the same, and is equal to the sum of W11, W12, and W13. Therefore, the width-to-length ratio W3/L3 of the channel region of the center sub-thin film transistor T3 is the smallest and the channel region of the center sub-thin film transistor T3 has the largest resistance. Accordingly, the center sub-thin film transistor T3 generates the least amount of heat.

In this embodiment, although the active layer is divided into three segments, one skilled in the art will appreciate that the active layer can also be divided into any other number of segments.

Figure 5:
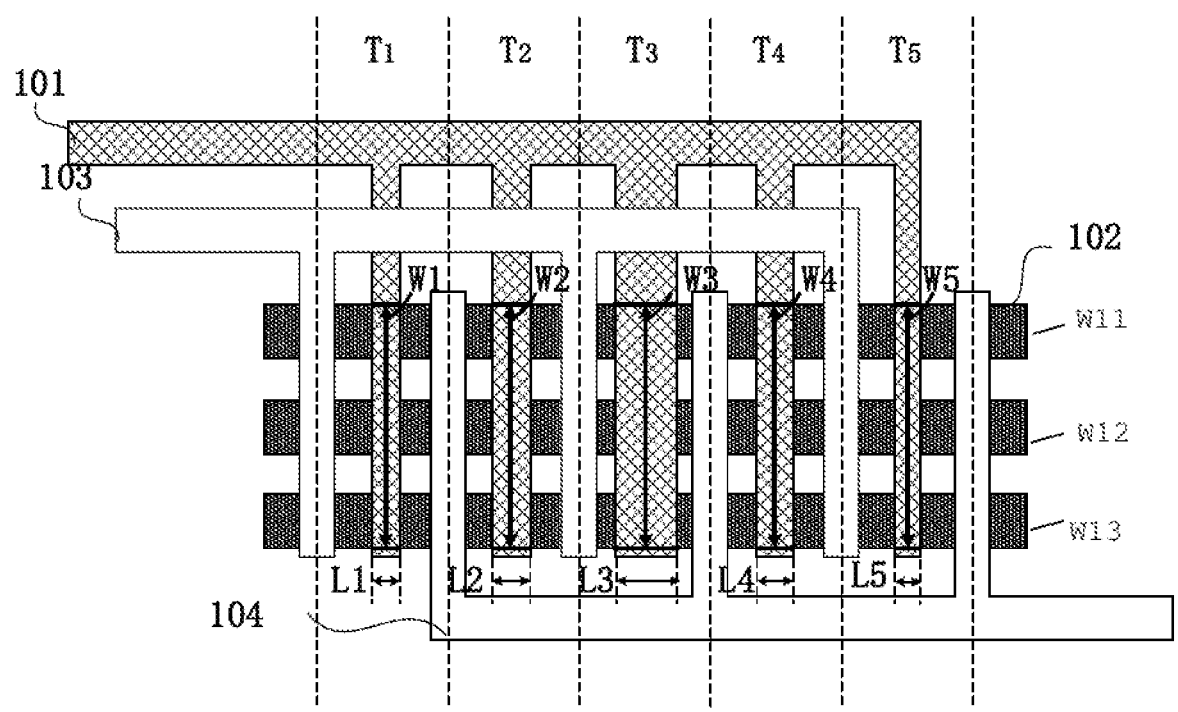
FIG. 5 is a schematic structural view of a thin-film transistor according to a fourth embodiment of the present disclosure.

FIG. 5 is a schematic view of a thin-film transistor according to a fourth embodiment of the present disclosure. In the present embodiment, the active layer of the thin-film transistor according to the second embodiment as shown in FIG. 3 is further divided into three segments of equal width in the vertical direction and the widths of the three segments W11, W12, and W13 are the same. Therefore, in this embodiment, the width of the channel region of each of the sub-thin film transistor is the same, and is equal to the sum of W11, W12, and W13. Therefore, the width-to-length ratio W3/L3 of the channel region of the center sub-thin film transistor T3 is the smallest and the channel region of the center sub-thin film transistor T3 has the largest resistance. Accordingly, the center sub-thin film transistor T3 generates the least amount of heat.

Figure 6:
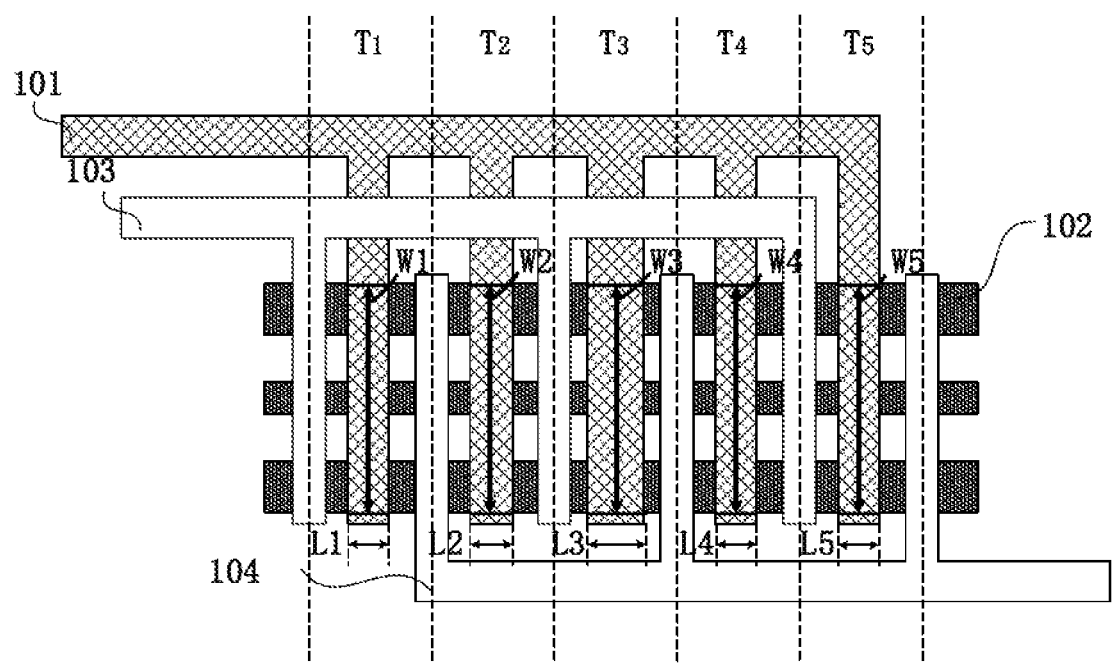
FIG. 6 is a schematic structural view of a thin-film transistor according to a fifth embodiment of the present disclosure.

FIG. 6 is a schematic view of a thin-film transistor according to a fifth embodiment of the present disclosure. In the present embodiment, the width W12 of the center segment of the active layer of the thin-film transistor according to the third embodiment as shown in FIG. 4 is further narrowed while the widths W11 and W13 of the two side segments are the same and wider than W12. The width of the channel region of each of the sub-thin film transistor is the same, and the width of the channel region is equal to the sum of W11, W12, and W13. Therefore, the width-to-length ratio W3/L3 of the channel region of the center sub-thin film transistor T3 is the smallest and the channel region of the center sub-thin film transistor T3 has the largest resistance. Accordingly, the center sub-thin film transistor T3 generates the least amount of heat.

In the present embodiment, although the center segment of the active layer has the narrowest width, one skilled in the art will appreciate that more than one center segment of the active layer can have the narrowest width. For example, when the active layer is divided into five segments in the vertical direction, the widths of the channel regions of three segments at the center can be set to the narrowest.

Figure 7:
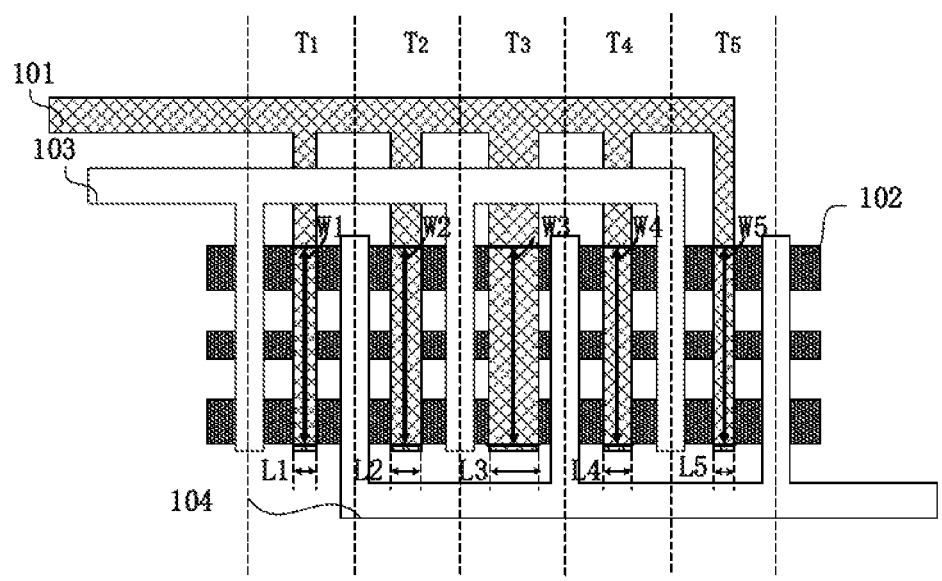
FIG. 7 is a schematic structural view of a thin-film transistor according to a sixth embodiment of the present disclosure.

FIG. 7 is a schematic view of a thin-film transistor according to a sixth embodiment of the present disclosure. In this embodiment, the width W12 of the center segment of the active layer of the thin-film transistor according to the fourth embodiment as shown in FIG. 5 is further narrowed and the widths W11 and W13 of the two side segments are the same and wider than W2. The width of the channel region of each of the sub-thin film transistors is the same, and is equal to the sum of W1, W2, and W3. Therefore, the width-to-length ratio W3/L3 of the channel region of the center sub-thin film transistor T3 is the smallest and the channel region of the center sub-thin film transistor T3 has the largest resistance. Accordingly, the center sub-thin film transistor T3 generates the least amount of heat.

Figure 8:
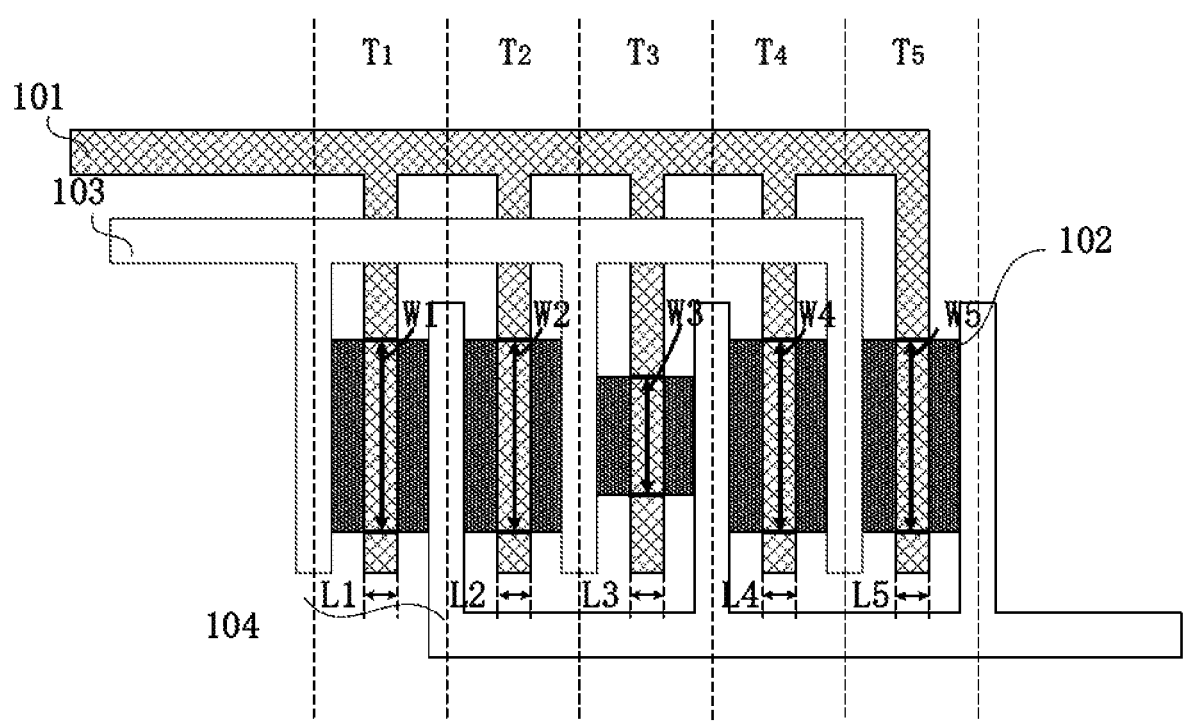
FIG. 8 is a schematic structural view of a thin-film transistor according to a seventh embodiment of the present disclosure.

FIG. 8 is a schematic view of a thin-film transistor according to a seventh embodiment of the present disclosure. In this embodiment, the lengths L1, L2, L3, L4, and L5 of the channel regions of the sub-thin film transistors T1, T2, T3, T4, and T5 are the same, and the width W3 of the channel region of the center sub-thin film transistor T3 at the center position is set to be the narrowest.

In addition, the widths W1, W2, W4, and W5 of the channel regions of the sub-thin film transistors T1, T2, T4, and T5 are the same and wider than W3.

As a result, in this embodiment, the channel region of the center sub-thin film transistor T3 has the smallest width-to-length ratio W3/L3 in comparison to the channel regions of the sub-thin film transistors T1, T2, T4, and T5. Accordingly, the channel region of the center sub-thin film transistor T3 has the largest resistance. Thus, during operation of the thin-film transistor, the center sub-thin film transistor T3 generates the least amount of heat and can effectively prevent the center portion of the thin-film transistor from being burnt due to overheating.

Figure 9:
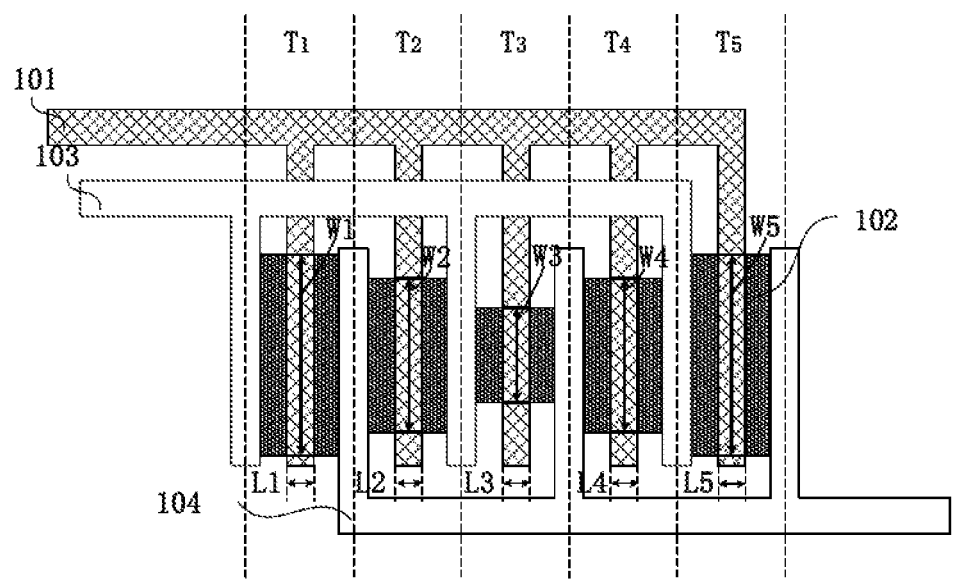
FIG. 9 is a schematic structural view of a thin-film transistor according to an eighth embodiment of the present disclosure.

FIG. 9 is a schematic view of a thin-film transistor according to an eighth embodiment of the present disclosure. In this embodiment, not only that the lengths L1, L2, L3, LA, and L5 of the channel regions of the sub-thin film transistors T1, T2, T3, T4, and T5 are the same and the channel region of the center sub-thin-film transistor T3 have the narrowest width, but also that the farther the distance of the sub-thin film transistors T1, T2, T4, and T5 from the center sub-thin film transistor T3, the wider the widths W1, W2, W4, and W5 of the channel regions of the sub-thin film transistors T1, T2, T4, and T5.

As shown in FIG. 9, the sub-thin film transistors T1 and T5 are farthest from the center sub-thin film transistor T3, and the sub-thin film transistors T2 and T4 are closer to the center sub-thin film transistor T3. Therefore, the channel regions of the sub-thin film transistors T1 and T5 have the widest widths W1 and W5, the channel regions of the sub-thin film transistors T2 and T4 have smaller widths than W1 and W5, and the channel region of the center sub-thin film transistor T3 has the smallest width W3. Therefore, the width-to-length ratio W3/L3 of the channel region of the center sub-thin film transistor T3 is the smallest and the channel region of the center sub-thin film transistor T3 has the largest resistance. Accordingly, the center sub-thin film transistor T3 generates the least amount of heat.

Figure 10:
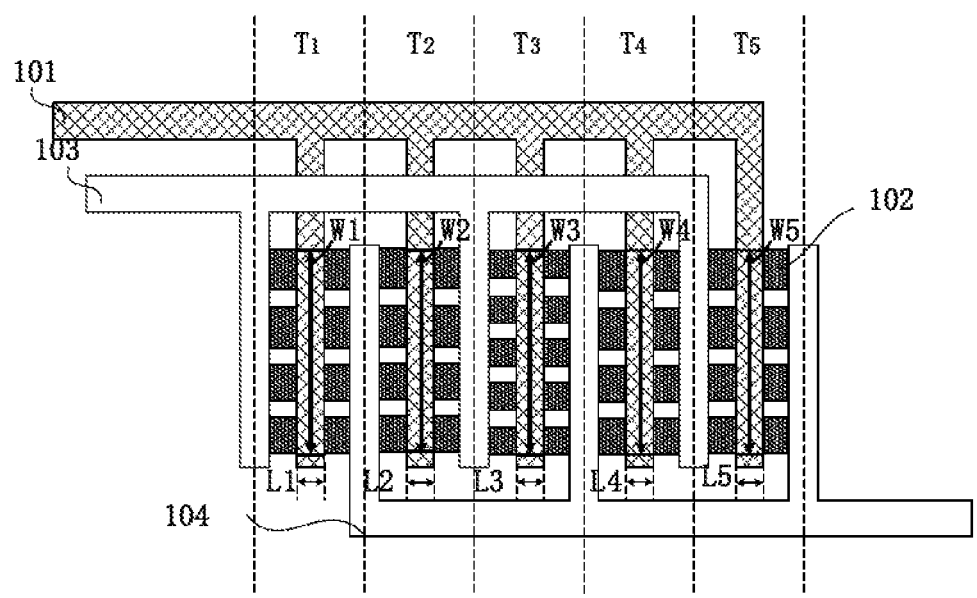
FIG. 10 is a schematic structural view of a thin-film transistor according to a ninth embodiment of the present disclosure.

FIG. 10 is a schematic view of a thin-film transistor according to a ninth embodiment of the present disclosure. In this embodiment, the active layer corresponding to the respective sub-thin film transistors of the thin-film transistor according to the seventh embodiment as shown in FIG. 8 is respectively divided into either four or five segments in the width direction.

As shown in FIG. 10, each sub-thin film transistors T1, T2, T3, T4, and T5 has an active layer region and the width of each of the active layer regions is the same. Furthermore, the active layer region corresponding to the center sub-thin film transistor T3 is divided into five segments in the vertical direction via four separators. Each of the respective active layer regions of the sub-thin film transistors T1, T2, T4, and T5 is divided into four segments via three separators. In the present embodiment, each separator has the same width and can be formed of the same material as the gate insulation layer. The width W3 of the channel region of the center sub-thin film transistor T3 is equal to the width of the active layer region subtracting the widths of the four separators. The respective widths W1, W2, W4, and W5 of the channel regions of the sub-thin film transistors T1, T2, T4, and T5 are equal to the respective widths of the active layer regions subtracting the widths of the three separators. That is, each of the widths W1, W2, W4, and W5 is larger than W3. Therefore, the width-to-length ratio W3/L3 of the channel region of the center sub-thin film transistor T3 is the smallest and the channel region of the center sub-thin film transistor T3 has the largest resistance. Accordingly, the center sub-thin film transistor T3 generates the least amount of heat.

Alternatively, in this embodiment, the widths of the active layer regions corresponding to the respective sub-thin-film transistors can be different, and the widths of the respective separators can also be different.

Figure 11:
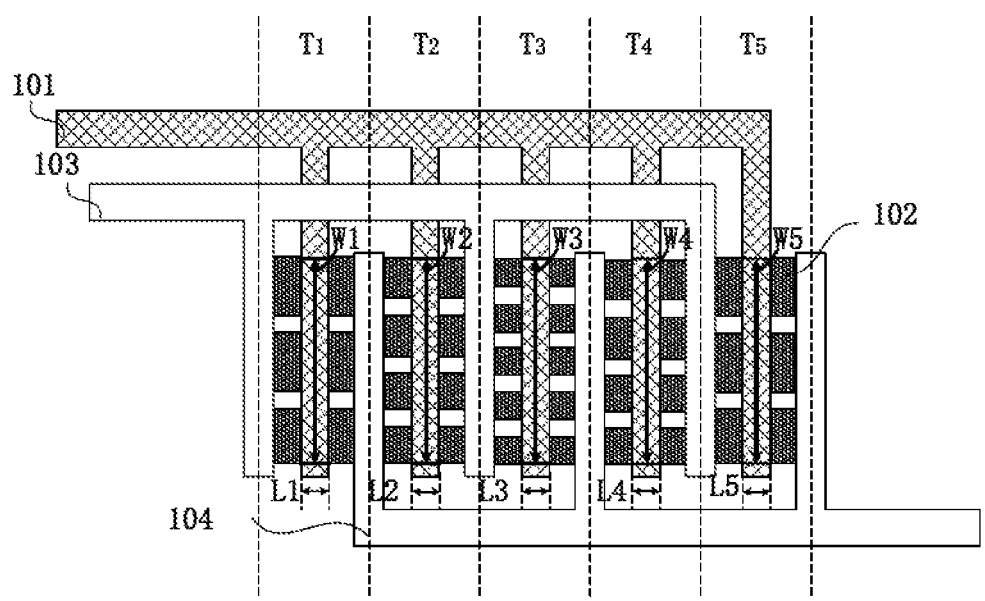
FIG. 11 is a schematic structural view of a thin-film transistor according to a tenth embodiment of the present disclosure.

FIG. 11 is a schematic view of a thin-film transistor according to a tenth embodiment of the present disclosure. The respective active layer regions of the sub-thin film transistors according to the eighth embodiment as shown in FIG. 9 are further divided into three, four, or five segments in the width direction.

As shown in FIG. 11, the respective active layer regions of the sub-thin film transistors T1, T2, T3, T4, and T5 have the same width. The active layer region of the center sub-thin film transistor T3 is divided into five segments in the width direction via four separators. Each of the respective active layer regions of the sub-thin film transistors T2 and T4 is divided into four segments via three separators. Each of the respective active layer regions of the sub-thin film transistors T1 and T5 is divided into three segments via two separators. In this embodiment, the separators have the same widths and can be formed of the same material as the gate insulation layer. The width W3 of the channel region of the center sub-thin film transistor T3 is equal to the width of the respective active layer region subtracting the widths of the four separators. Each of the respective widths W2 and W4 of the channel regions of the sub-thin-film transistors T2 and T4 is equal to the width of the respective active layer region subtracting the widths of the three separators. Each of the respective widths W1 and W5 of the channel regions of the sub-thin-film transistors T1 and T5 is equal to the width of the respective active layer region subtracting the widths of the two separators. That is, each of the widths W1 and W5 is larger than each of W2 and W4, and each of the widths W2 and W4 is larger than W3. Therefore, the width-to-length ratio W3/L3 of the channel region of the center sub-thin film transistor T3 is the smallest and the channel region of the center sub-thin film transistor T3 has the largest resistance. Accordingly, the center sub-thin film transistor T3 generates the least amount of heat.

Although in this embodiment, the active layer regions corresponding to the sub-thin film transistors are respectively divided into three, four, or five segments, one skilled in the art will appreciate that the active layer region can also be divided into any other number of segments.

Figure 12:
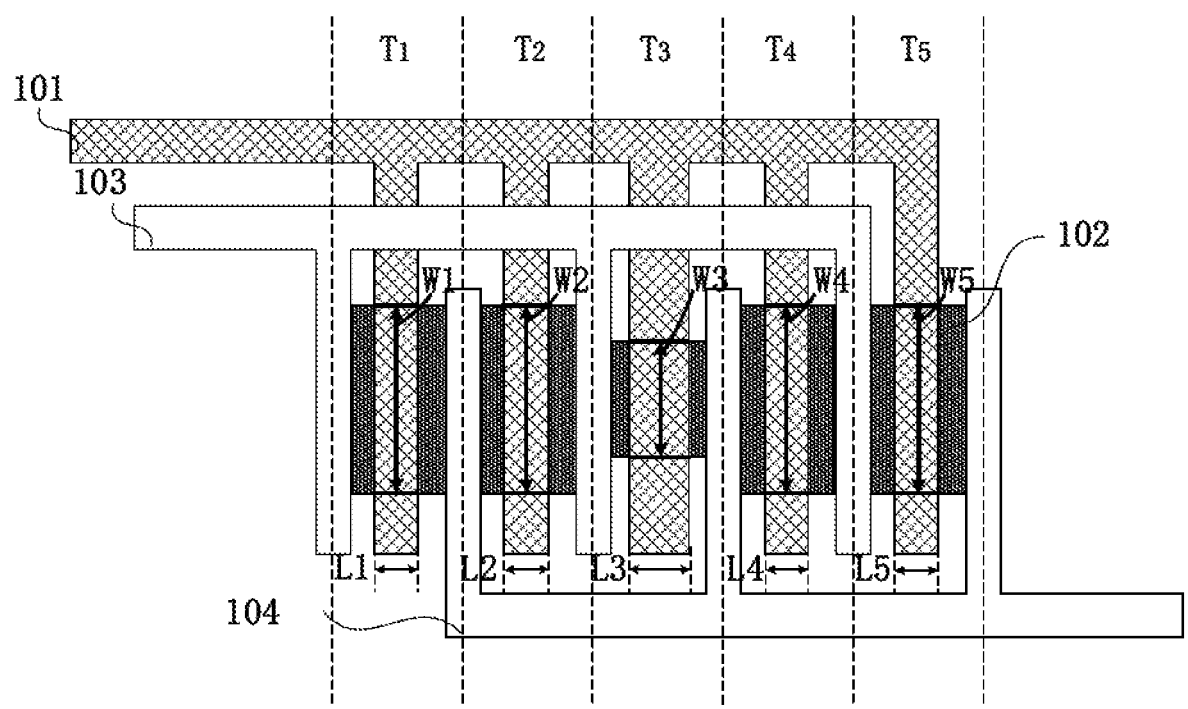
FIG. 12 is a schematic structural view of a thin-film transistor according to a eleventh embodiment of the present disclosure.

FIG. 12 is a plan view of a thin-film transistor according to an eleventh embodiment of the present disclosure. In this embodiment, the length L3 of the channel region of the center sub-thin film transistor T3 is the longest, and the width W3 of the channel region is the smallest.

Further, the lengths of the channel regions L1, L2, L4, and L5 of the sub-thin film transistors T1, T2, T4, and T5 are the same and the widths W1, W2, W4, and W5 of the channel regions of the sub-thin film transistors T1, T2, T4, and T5 are the same.

Alternatively, in this embodiment, the lengths L1, L2, L4, and L5 of the channel regions of the sub-thin film transistors T1, T2, T4, and T5 can be the same as those in the embodiment shown in FIG. 3. That is, the larger the respective distance of the sub-thin film transistors T1, T2, T4, and T5 from the center sub-thin film transistor T3, the shorter the lengths L1, L2, L4, and L5 of the channel regions of the sub-thin film transistors T1, T2, T4, and T5.

Alternatively, in this embodiment, the widths W1, W2, W4, and W5 of the sub-thin film transistors T1, T2, T4, and T55 can be the same as those in the embodiment shown in FIG. 9. That is, the larger the respective distance of the sub-thin-film transistors T1, T2, T4, and T5 from the center sub-thin film transistor T3, the larger the widths W1, W2, W4, and W5.

Alternatively, in this embodiment, the widths W1, W2, W3, W4, and W5 of the channel regions of the sub-thin film transistors T1, T2, T3, T4, and T5 can be the same as those in the embodiment shown in FIG. 10. That is, the widths of the active layer regions corresponding to the sub-thin film transistors T1, T2, T3, T4, and T5 are the same, the active layer region corresponding to the center sub-thin film transistors T3 is separated into five segments in the width direction by separators having the same width, and each of the active layer regions corresponding to the sub-thin film transistors T1, T2, T4, and T5 is divided into four segments in the width direction by three separators having the same width.

Alternatively, in this embodiment, the widths W1, W2, W3, W4, and W5 of the channel regions of the sub-thin film transistors T1, T2, T3, T4, and T5 can be the same as those in the embodiment shown in FIG. 11. That is, the widths of the active layer regions of the sub-thin film transistors T1, T2, T3, T4, and T5 are the same, the active layer region of the center sub-thin film transistors T3 is separated into five segments in the width direction by separators having the same width, each of the respective active layer regions of the sub-thin film transistors T2 and T4 is divided into four segments, and each of the respective active layer regions of the sub-thin film transistors T1 and T5 is divided into three segments.

Therefore, in this embodiment, in comparison with the sub-thin film transistors T1, T2, T4, and T5, the width-to-length ratio W3/L3 of the channel region of the center sub-thin film transistor T3 is the smallest and the channel region of the center sub-thin film transistor T3 has the largest resistance. Accordingly, the center sub-thin film transistor T3 generates the least amount of heat. Thus, during operation of the thin-film transistor, the center sub-thin film transistor T3 generates the least amount of heat and effectively prevents the center portion of the thin-film transistor from being burnt due to overheating.

The thin-film transistor according to the above embodiments can be used in a gate driver circuit or a pixel circuit to achieve a large current while avoiding breakdown.

Figure 13:
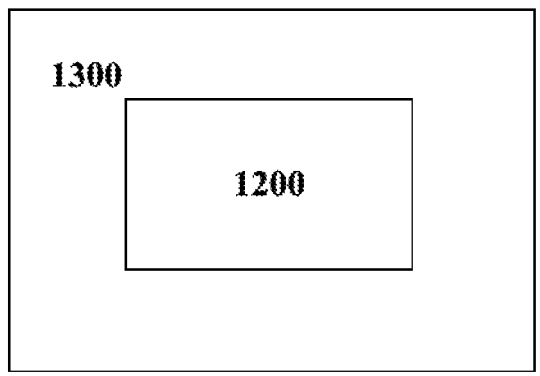
FIG. 13 is a schematic diagram of a gate driver circuit in accordance with one embodiment of the present disclosure.

FIG. 13 is a schematic diagram of a gate driver circuit 1300 in accordance with an embodiment of the present disclosure. As shown in FIG. 13, the gate driver circuit 1300 can include the thin film transistor 1200 as shown in any of FIGS. 2 to 12.

Figure 14:
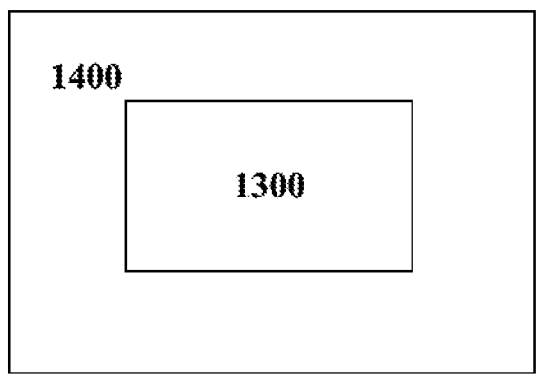
FIG. 14 is a schematic diagram of a display panel according to one embodiment of the present disclosure.

FIG. 14 is a schematic diagram of an array substrate 1400 in accordance with an embodiment of the present disclosure. For example, the array substrate 1400 includes the gate driver circuit 1300 as shown in FIG. 13. In some embodiments, the array substrate 1400 includes the thin film transistor 1200 as shown in any of FIGS. 2 to 12. The array substrate 1400 according to an embodiment of the present disclosure can be used for any product or component having a display function. Such products or components include, but are not limited to, display devices, wearable devices, mobile phones, tablets, televisions, notebook computers, digital photo frames, navigators, and the like.

Although the thin film transistor is formed in parallel using five sub-thin film transistors in the above embodiments, one skilled in the art will appreciate that any other number of sub-thin film transistors such as 3, 7, or 9 sub-thin film transistors can be formed in parallel in the thin film transistor of the present disclosure.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A thin, film, transistor, comprising:
    a substrate;
    a source electrode on the substrate, the source electrode comprising a first teeth portion, the first teeth portion comprising a plurality of teeth arranged at intervals in a first direction;
    a drain electrode on the substrate, the drain electrode comprising a second teeth portion, the second teeth portion comprising a plurality of teeth arranged at intervals in the first direction;
    a gate on the substrate, the gate comprising a third teeth portion, the third teeth portion comprising a plurality of teeth arranged at intervals in the first direction; and
    an active layer on the substrate, the active layer comprising a plurality of channel regions arranged at intervals in the first direction; each of the plurality of channel regions has a length in the first direction and a width in a second direction, the second direction being perpendicular to the first direction;
    wherein the first teeth portion, the second teeth portion, the third teeth portion, and the active layer form a plurality of sub-thin film transistors connected in parallel, the plurality of sub-thin film transistors comprising at least a center sub-thin film transistor at a center position of the plurality of sub-thin film transistors in the first direction, and
    the center sub-thin film transistor has a channel region having a smallest width-to-length ratio among the plurality of sub-thin film transistors.

2. The thin film transistor according to claim 1, wherein a length of the channel region of the center sub-thin film transistor is longest among those of the plurality of sub-thin film transistors, and widths of the channel regions of the plurality of sub-thin film transistors are the same.

3. The thin film transistor according to claim 2, wherein lengths of channel regions of the plurality of sub-thin film transistors except the center sub-thin film transistor are the same.

4. The thin film transistor according to claim 2, wherein a length of a channel region of a sub-thin film transistor among the plurality of sub-thin film transistors decreases as a distance of the respective sub-thin film transistor from the center sub-thin film transistor increases.

5. The thin film transistor according from claim 1, wherein the active layer is divided into a plurality of separated segments in the second direction.

6. The thin film transistor according to claim 5, wherein the plurality of the separated segments of the active layer has a same width in the second direction.

7. The thin film transistor according to claim 5, wherein the plurality of the separated segments of the active layer has different widths in the second direction.

8. The thin film transistor according to claim 7, wherein a width in the second direction of at least one center segment among the plurality of separated segments is smaller than a width in the second direction of each of the other segments of the plurality of separated segments.

9. The thin film transistor according to claim 1, wherein a width of the channel region of the center sub-thin film transistor is shortest among those of the plurality of sub-thin film transistors, and lengths of the channel regions of the plurality of sub-thin film transistors are the same.

10. The thin film transistor according to claim 9, wherein widths of the channel regions of the other sub-thin film transistors except the center sub-thin film transistor are the same.

11. The thin film transistor according to claim 9, wherein a width of a channel region of a sub-thin film transistor among the plurality of sub-thin film transistors increases as a distance of the respective sub-thin film transistor from the center sub-thin film transistor increases.

12. The thin film transistor according to claim 9, wherein the active layer is divided into a plurality of separated segments in the second direction.

13. The thin film transistor according to claim 12, wherein the plurality of the separated segments of the active layer has a same width in the second direction.

14. The thin film transistor according to claim 12, wherein a width in the second direction of at least one center segment among the plurality of separated segments is smaller than a width in the second direction of each of the other segments of the plurality of separated segments.

15. The thin film transistor according to claim 1, wherein a length of the channel region of the center sub-thin film transistor is longest among those of the plurality of sub-thin film transistors, and a width of the channel region of the center sub-thin film transistor is shortest among those of the plurality of sub-thin film transistors.

16. The thin film transistor according to claim 15, wherein a length of a channel region of a sub-thin film transistor among the plurality of sub-thin film transistors decreases as a distance of the respective sub-thin film transistor from the center sub-thin film transistor increases.

17. The thin-film transistor according to claim 15, wherein a width of a channel region of a sub-thin film transistor among the plurality of sub-thin film transistors increases as a distance of the respective sub-thin film transistor from the center sub-thin film transistor increases.

18. A gate driver circuit comprising the thin-film transistor according to claim 1.

19. An array substrate comprising the gate driver circuit according to claim 18.

20. A display apparatus comprising the array substrate according to claim 19.

* * * * *